US012563956B2

(12) United States Patent
Im

(10) Patent No.: US 12,563,956 B2
(45) Date of Patent: Feb. 24, 2026

(54) DISPLAY DEVICE

(71) Applicant: LG Display Co., Ltd., Seoul (KR)

(72) Inventor: Ganghoon Im, Seoul (KR)

(73) Assignee: LG Display Co., Ltd., Seoul (KR)

( * ) Notice: Subject to any disclaimer, the term of this patent is extended or adjusted under 35 U.S.C. 154(b) by 411 days.

(21) Appl. No.: 18/218,941

(22) Filed: Jul. 6, 2023

(65) Prior Publication Data

US 2024/0049582 A1     Feb. 8, 2024

(30) Foreign Application Priority Data

Aug. 3, 2022     (KR) ........................ 10-2022-0096608

(51) Int. Cl.
*H10K 59/80*          (2023.01)
*H01L 23/31*          (2006.01)
*H01L 25/16*          (2023.01)
*G09G 3/3233*          (2016.01)

(52) U.S. Cl.
CPC ..... *H10K 59/8792* (2023.02); *H01L 23/3121* (2013.01); *H01L 25/167* (2013.01); *G09G 3/3233* (2013.01); *G09G 2300/0842* (2013.01)

(58) Field of Classification Search
CPC ................... G06F 1/203; G06F 1/1637; G02F 1/133509–133512; G02F 1/133533; G02F 1/13336; G02F 1/133516; G02F 1/133528; G02F 1/133621; G02F 1/13363; G02F 1/1339; G02F 1/1351; G02F 1/13352; G02F 1/136209; G02F 2201/08; G02F 2001/133354; G09G 3/3222; G09G 2300/0842; H10K 30/87;

H10K 50/125; H10K 50/85; H10K 50/86; H10K 50/865; H10K 50/868; H10K 59/126; H10K 59/30; H10K 59/875; H10K 59/8792; H10K 59/8793; H05K 7/20954–20963; H01L 25/167; H01L 23/3121; B32B 2457/20; B32B 2457/208; B32B 2307/402
See application file for complete search history.

(56) References Cited

U.S. PATENT DOCUMENTS

| | | | |
|---|---|---|---|
| 9,081,230 B2 | 7/2015 | Huang et al. | |
| 2014/0016043 A1 | 1/2014 | Chen et al. | |
| 2014/0327861 A1 | 11/2014 | Huang et al. | |
| 2015/0115297 A1* | 4/2015 | Lee ...................... | G06F 1/1601 |
| | | | 257/89 |

(Continued)

FOREIGN PATENT DOCUMENTS

| | | | | |
|---|---|---|---|---|
| CN | 102736295 A | | 10/2012 | |
| CN | 112596312 A | * | 4/2021 | ......... G02F 1/13454 |

(Continued)

OTHER PUBLICATIONS

CN-112596312-A English Translation (Year: 2021).*

(Continued)

*Primary Examiner* — Amir A Jalali
(74) *Attorney, Agent, or Firm* — Fenwick & West LLP

(57)          ABSTRACT

A display device includes a light-blocking film on the entire rear surface of a display panel, extending along side portions of the display panel, and attached to a film member on the entire front surface of the display panel. The light-blocking film is configured to prevent light leakage occurring from the rear surface and side surfaces of the display panel.

25 Claims, 9 Drawing Sheets

*A*                                                                          *A'*

(56) References Cited

U.S. PATENT DOCUMENTS

| | | | | |
|---|---|---|---|---|
| 2017/0059926 A1* | 3/2017 | Kim | ................. | G02F 1/133512 |
| 2018/0019293 A1* | 1/2018 | Choi | .................... | H10K 59/126 |
| 2019/0171060 A1 | 6/2019 | Chen et al. | | |
| 2021/0074780 A1* | 3/2021 | Woo | ....................... | H10K 59/12 |
| 2021/0080784 A1 | 3/2021 | Matsuoka | | |
| 2023/0071577 A1* | 3/2023 | Woo | .................... | H10K 59/124 |

FOREIGN PATENT DOCUMENTS

| | | | |
|---|---|---|---|
| EP | 2528424 | B1 | 12/2018 |
| EP | 3929655 | A1 | 12/2021 |
| KR | 10-1854696 | B1 | 5/2018 |
| KR | 10-2209414 | B1 | 1/2021 |

OTHER PUBLICATIONS

Intellectual Property Office of India, Office Action, Indian Patent Application No. 202314050699, Oct. 28, 2025, seven pages.
Intellectual Property Office of Vietnam, Office Action, Vietnamese Patent Application No. 1-2023-04871, Sep. 29, 2025, four pages.

\* cited by examiner (a)

(b)

DISPLAY DEVICE

CROSS-REFERENCE TO RELATED APPLICATION

This application claims priority to and the benefit of Republic of Korea Patent Application No. 10-2022-0096608, filed on Aug. 3, 2022, which is hereby incorporated by reference in its entirety.

BACKGROUND

Technical Field

Embodiments relate to a display device, specifically relate to a display device with a light-blocking member.

Description of Related Art

Display devices are widely used as display screens for notebook computers, tablet computers, smartphones, portable display devices, portable information devices, and the like, in addition to display devices for televisions or monitors.

Display devices may be categorized as reflective display devices and light-emitting display devices. Here, reflective display devices are configured such that natural light or light exiting from an external lighting device is reflected so as to display information. Each of light-emitting display devices is internally provided with light-emitting devices or a light source therein to display information using light generated by the internal light-emitting devices or the internal light source.

BRIEF SUMMARY

In one embodiment, a display device includes a display panel comprising a front surface and a rear surface; a film member comprising a front surface and a rear surface, the front surface of the display panel attached to a first portion of the rear surface of the film member; and a light-blocking member disposed on an entire rear surface of the display panel, the light-blocking member extending along a side portion of the display panel and attached to a second portion of the rear surface of the film member.

In one embodiment, a display device includes a film member; a display panel on the film member; and a light-blocking member on the display panel. The light-blocking member includes a first portion that overlaps a planar surface of the display panel; a second portion that extends from the first portion and overlaps a side surface of the display panel; and a third portion that extends from the second portion and is in contact with the film member.

In one embodiment, a display device comprises a display panel comprising a front surface and a back surface; a film member comprising a front surface and a rear surface, a portion of the rear surface of the film member attached to the front surface of the display panel; and a light-blocking member. The light-blocking member includes a first portion attached to the rear surface of the display panel, the first portion covering the first surface of the display panel in its entirety; a second portion connected to the first portion, the second portion extending along a side surface of the display panel, and covering the side surface of the display panel; a third portion connected to the second portion, the third portion attached to a portion of the rear surface of the film member that is non-overlapping with the display panel.

According to embodiments, the display device may have a structure able to prevent or at least reduce light leakage from occurring from the rear surface and side surfaces of the display device.

According to embodiments, the display device may have a structure able to reduce the width of a bezel and the thickness of a module.

According to embodiments, the display device may have a structure able to simplify a fabrication process and improve the reliability of products by reducing defects in the process.

DESCRIPTION OF DRAWINGS

The above and other objectives, features, and advantages of the present disclosure will be more clearly understood from the following detailed description, taken in conjunction with the accompanying drawings, in which.

DETAILED DESCRIPTION

Figure 1:
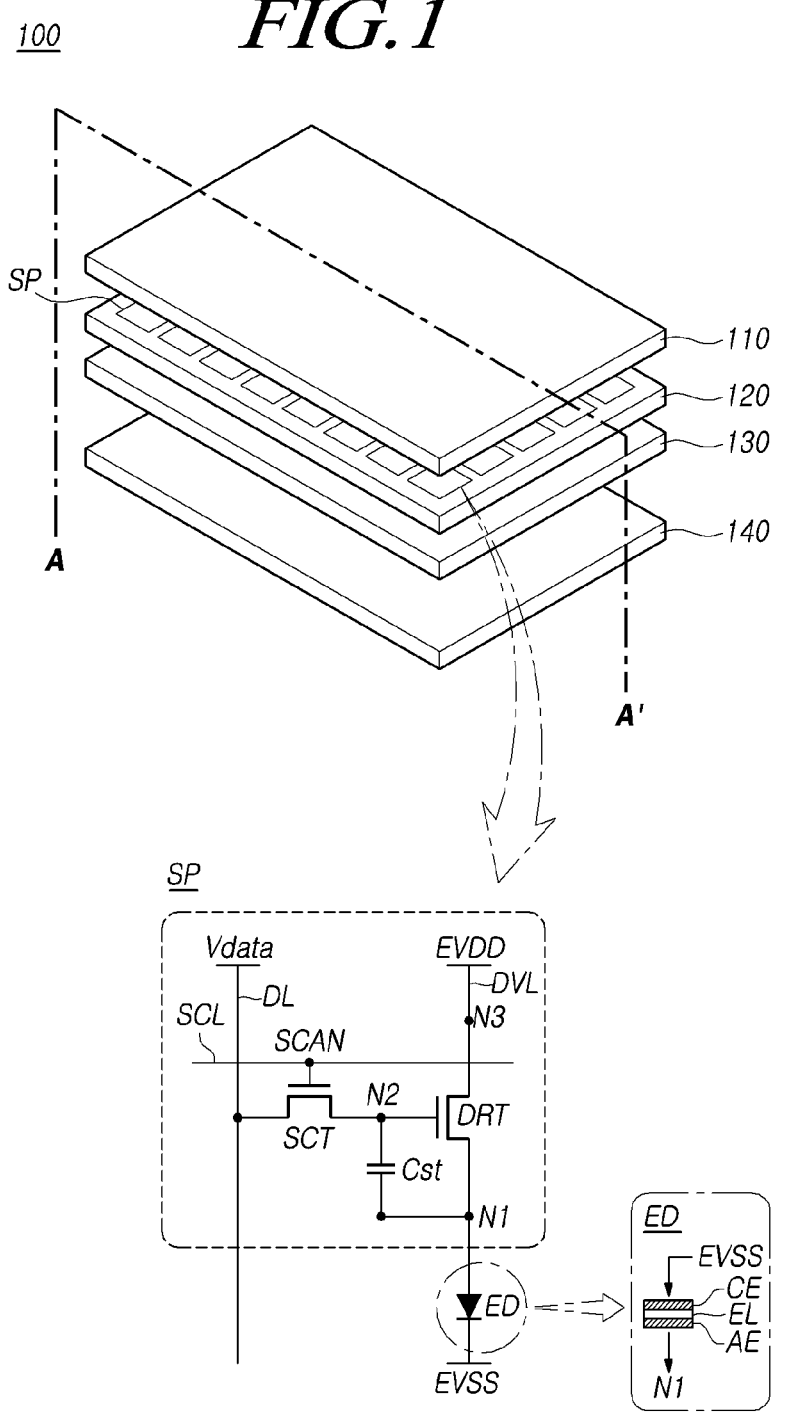
FIG. 1 is a diagram illustrating a system configuration of a display device according to one or more embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating a system configuration of a display device 100 according to embodiments. Referring to FIG. 1, a display drive system of the display device 100 according to embodiments may include a display panel 120 and a display driver circuit for driving the display panel 120.

The display panel 120 may include an active area in which images are displayed and a non-active area on which no images are displayed. The display panel 120 may include a plurality of subpixels SP disposed on a substrate to display images.

Referring to FIG. 1, in the display device 100 according to embodiments, each of the subpixels SP may include an emitting device ED and a pixel driver circuit SPC for driving the emitting device ED. The pixel driver circuit SPC may include a driver transistor DRT, a scan transistor SCT, and a storage capacitor Cst.

The driver transistor DRT may drive the emitting device ED by controlling current flowing to the emitting device ED. The scan transistor SCT may transfer a data voltage Vdata to a second node N2, i.e., a gate node, of the driver transistor DRT. The storage capacitor Cst may be configured to maintain a voltage for a predetermined period of time.

The emitting device ED may include an anode AE, a cathode CE, and an emitting layer EL located between the anode AE and the cathode CE. The anode AE may be a pixel electrode involved in the formation of the emitting device ED in each of the subpixels SP, and may be electrically connected to a first node N1 of the driver transistor DRT. The cathode CE may be a common electrode involved in the formation of the emitting devices ED of the entirety of the subpixels SP. A base voltage EVSS may be applied to the cathode CE.

For example, the emitting device ED may be an organic light-emitting diode (OLED), an inorganic material based light-emitting diode (LED), a quantum dot light-emitting device that is a self-emitting semiconductor crystal, or the like.

When the display device 100 according to embodiments is an OLED display device, each of the subpixels SP may include a self-emitting OLED as a light-emitting device. When the display device 100 according to embodiments is a quantum dot light-emitting device, each of the subpixels SP may include a self-emitting device comprised of a quantum dot that is a self-emitting semiconductor crystal. When the display device 100 according to embodiments is a micro-LED display device, each of the subpixels SP may include, as a light-emitting device, a micro-LED configured to emit light by itself and based on an inorganic material.

The driver transistor DRT may include the first node N1, the second node N2, a third node N3, and the like. The first node N1 may be a source node or a drain node, and may be electrically connected to the anode AE of the emitting device ED. The second node N2 may be gate node, and may be electrically connected to a source node or a drain node of the scan transistor SCT. A gate node of the scan transistor SCT may be electrically connected to a scan line (SCL) through which a SCAN signal is supplied. The third node N3 may be a drain node or a source node, and may be electrically connected to a drive voltage line DVL through which a drive voltage is supplied. A supply voltage EVDD may be applied to the third node N3. Hereinafter, for convenience of description, the first node N1 and the third node N3 will be described as being a source node and a drain node, respectively, as an example.

The scan transistor SCT may switch a connection between a data line DL and the second node N2 of the driver transistor DRT. The scan transistor SCT may control the connection between the second node N2 of the driver transistor DRT and a corresponding data line DL among a plurality of data lines DL.

The storage capacitor Cst may be provided between the first node N1 and the second node N2 of the driver transistor DRT.

The structure of the subpixel SP illustrated in FIG. 1 is only an example for description, and the subpixel SP may further include one or more transistors or one or more capacitors. Alternatively, each of the plurality of subpixels may have the same structure, or some of the plurality of subpixels may have a different structure. Each of the driver transistor DRT and the scan transistor SCT may be an n-type transistor or a p-type transistor.

In addition, the display device 100 according to embodiments may have a top emission structure or a bottom emission structure. Hereinafter, the display device will be described as having the top emission structure as an example. For example, when the display device has the top emission structure, the anode AE may be a reflective metal, and the cathode CE may be a transparent conductive film.

Figure 2:
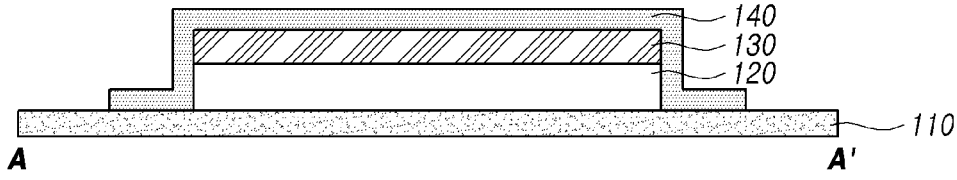
FIG. 2 is a cross-sectional diagram illustrating a display device according to one or more embodiments of the present disclosure.

FIG. 2 is a cross-sectional diagram illustrating a display device according to embodiments. Specifically, FIG. 2 is a cross-sectional diagram of the display device illustrated in FIG. 1, taken along the line A-A'.

Referring to FIG. 2, the display device according to embodiments includes a film member 110, a display panel 120, and a light-blocking member 140. The light-blocking member 140 includes a first portion that overlaps a planar surface of the display panel 120, a second portion that extends from the first portion and overlaps a side surface of the display panel 120, and a third portion that extends from the second portion and is in contact with film member 110.

The display panel 120 may include a drive layer, an emitting layer, an encapsulation layer provided on a substrate formed of transparent glass or plastic.

The emitting layer may include light-emitting devices each of which is provided in a corresponding one of pixels of the display panel 120 and connected to a driver circuit of the drive layer.

Each of the light-emitting devices may include an anode connected to a driver transistor in the drive layer, a cathode connected to a second power line, and an emitting area located between the anode and the cathode.

The encapsulation layer may encapsulate the drive layer and the emitting layer, thereby preventing external moisture or the like from permeating into the drive layer and the emitting layer.

In addition, the drive layer, the emitting layer, and the encapsulation layer described above may be provided in the active area.

Pads connected to an external circuit and a line pattern transferring drive signals to the drive layer in the active area may be provided in the non-active area.

The film member 110 may be disposed on the front surface of the display panel 120, and the light-blocking member 140 may be disposed on the rear surface of the display panel 120.

The light-blocking member 140 may be disposed on the entire rear surface of the display panel 120, extend along side portions of the display panel 120, and be attached to the rear surface of the film member 110.

The light-blocking member 140 may extend beyond an end of the display panel 120 by a predetermined length and be attached to the rear surface of the film member 110. In some embodiments, the light-blocking member 140 may extend beyond each end of the light-blocking member by a predetermined length.

The light-blocking member 140 may be attached to the rear surface of the film member 110, with the entire area thereof extending a predetermined length outside the film member 110.

Since the light-blocking member 140 is attached to the rear surface of the film member 110 with the entire area thereof extending the predetermined length outside the film member 110, light leakage occurring from the rear surface and side surfaces of the display panel may be prevented and the width of a bezel and the thickness of a module may be reduced.

In addition, a portion of the light-blocking member 140 may extend a predetermined length outside the film member 110 and be attached to the film member 110.

A portion, rather than the entire area, of the light-blocking member 140 may extend a predetermined length outside the film member 110 and be attached to the film member 110. The light-blocking member 140 may be attached to the rear surface of the film member 110, with the remaining area thereof extending along side portions of the display panel 120 instead of extending outside the film member 110.

For example, when components are disposed outside the film member 110, in areas corresponding to the components, a portion of the light-blocking member 140 may extend a predetermined length outside the film member 110 to a position adjacent to an area in which the components are located and be attached to the film member 110. The remaining portion of the light-blocking member 140 may extend along side portions of the display panel 120 and be attached to the rear surface of the film member 110.

When a portion of the light-blocking member 140 extends a predetermined length outside the film member 110 and is attached to the rear surface of the film member 110, only a specific area may be increased, thereby further reducing the width of the bezel.

The light-blocking member 140 may be a colored light-blocking film.

The colored light-blocking film may be a colored film. The colored film may include a black pigment or black dye in a polymer film. The polymer film may be a triacetyl cellulose (TAC) film, a polyethylene terephthalate (PET) film, a polycarbonate (PC) film, or the like. Specifically, the colored light-blocking film may be a black PET film.

The application of the colored light-blocking film as the light-blocking member 140 may effectively prevent or at least reduce light leakage occurring from the rear surface and side surfaces of the display panel 120. It is possible to reduce problems related to the application of ink so as to simplify a fabrication process. It is possible to improve the reliability of products by reducing defects in the process.

Figure 3:
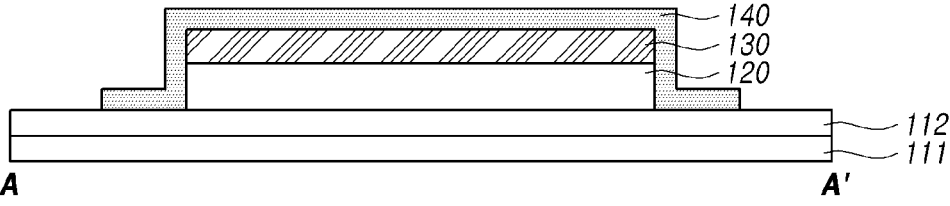
FIGS. 3 to 5 are cross-sectional diagrams illustrating display devices according to one or more embodiments of the present disclosure.
Figure 4:
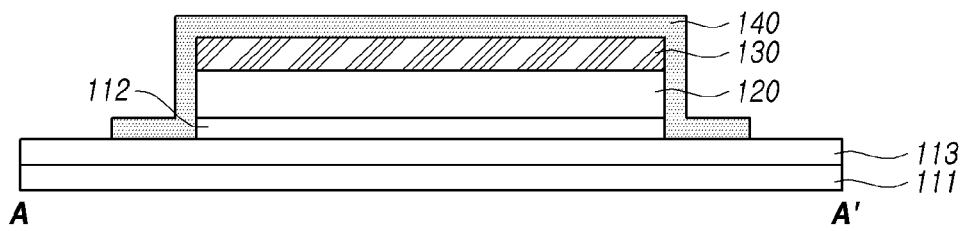
Figure 5:
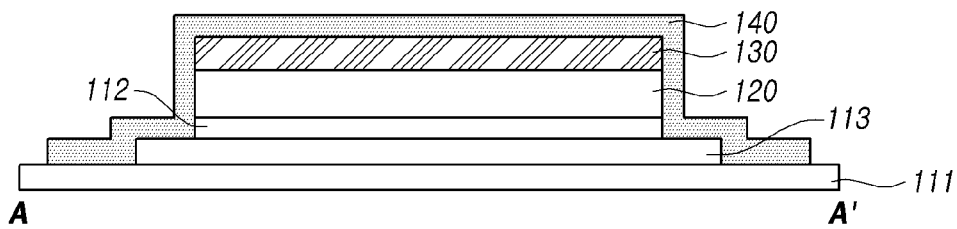

FIGS. 3 to 5 are cross-sectional diagrams illustrating display devices according to other embodiments. The display device includes a film member 110, a display panel 120, and a light-blocking member 140. The light-blocking member 140 includes a first portion that overlaps a planar surface of the display panel 120, a second portion that extends from the first portion and overlaps a side surface of the display panel 120, and a third portion that extends from the second portion and is in contact with the film member. In some embodiments, the third portion of the light-blocking member 140 has a predetermined width. In some embodiments, the third portion is non-overlapping with the display panel 120.

Specifically, FIG. 3 illustrates the light-blocking member 140 attached to a touch member 112 configured to sense touch of the display device 100, FIG. 4 illustrates the light-blocking member 140 attached to a polarization member 113, and FIG. 5 illustrates the light-blocking member 140 attached to a cover window 111. In some embodiments, the second portion of the light-blocking member overlaps a side surface of the touch member. In some embodiments, the second portion of the light-blocking member is in contact with a surface of the polarization member.

Referring to FIGS. 3 to 5, film member 110 may be at least one of the cover window 111, the touch member 112 configured to sense a touch of the display device 100, or the polarization member 113 configured to polarize light emitted by the display panel, but is not limited thereto. That is, at least one of the cover window 111, the touch member 112, and the polarization member 113 may be disposed on the front surface of the display panel 120.

The light-blocking member 140 extending to be attached to the film member 110 may be attached to the touch member 112, the polarization member 113, or the cover window 111 of the film member 110.

When the light-blocking member 140 is attached to the polarization member 113, the cover window 111, or the like of the film member 110, the light-blocking member 140 may extend along side portions of the display panel 120 and the touch member 112 and be attached to the rear surface of the polarization member 113, the cover window 111, or the like of the film member 110.

In this case, as described above, the entire area or a portion of the light-blocking member 140 may extend to be attached to the polarization member 113, the cover window 111, or the like of the film member 110.

When the light-blocking member 140 is attached to the cover window 111 or the like of the film member 110, the light-blocking member 140 may extend along side portions of the display panel 120, the touch member 112, and the polarization member 113 and be attached to the rear surface of the cover window 111 or the like of the film member 110.

In this case, as described above, the entire area or a portion of the light-blocking member 140 may extend to be attached to the cover window 111 or the like of the film member 110.

In addition, when the light-blocking member 140 is attached to the cover window 111 or the like of the film member 110, the light-blocking member 140 may extend along side portions of the display panel 120 and the touch member 112 and along side portions of the polarization member 113 and extend outside the polarization member 113 and be attached to the rear surface of the cover window 111 or the like of the film member 110.

In this case, the entire area or a portion of the light-blocking member 140 may extend to be attached to the cover window 111 or the like of the film member 110.

In addition, a portion of the light-blocking member 140 may extend to be attached to the polarization member 113, and the remaining portion of the light-blocking member 140 may extend to be attached to the cover window 111 or the like of the film member 110.

A heat dissipation member 130 may be disposed between the display panel 120 and the light-blocking member 140. The heat dissipation member 130 is configured to dissipate heat generated by the display panel 120.

Figure 6:
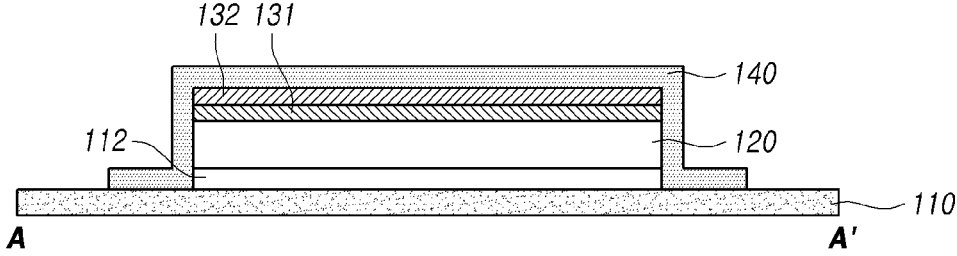
FIG. 6 is a cross-sectional diagram illustrating a display device according to one or more embodiments of the present disclosure.

FIG. 6 is a cross-sectional diagram illustrating a display device according to other embodiments.

Referring to FIG. 6, first and second heat dissipation members 131 and 132 may be disposed between the display panel 120 and the light-blocking member 140.

The heat dissipation member 130 may contain a carbon material or a metal material.

The carbon material may be graphite, but is not limited thereto. The carbon material may be carbon nanofiber, carbon nanotubes, or the like.

The metal material may be copper (Cu), but is not limited thereto. The metal material may be one among nickel (Ni), iron (Fe), zinc (Zn), SUS, molybdenum (Mo), silver (Ag), platinum (Pt), gold (Au), aluminum (Al), chromium (Cr), indium (In), tin (Sn), magnesium (Mg), phosphorus (P), manganese (Mn), or mixtures or alloys thereof.

The metal material may be metal powder or a metal thin film.

The heat dissipation member 130 may include the first heat dissipation member 131 containing a metal material.

The heat dissipation member 130 may further include a second heat dissipation member disposed between the first heat dissipation member 131 and the light-blocking member 140 and containing a carbon material.

In addition, although not shown, the heat dissipation member 130 may include a second heat dissipation member containing a carbon material.

In addition, although not shown, the heat dissipation member 130 may further include a first heat dissipation member disposed between the second heat dissipation member and the light-blocking member and containing a carbon material.

The heat dissipation member 130 is disposed between the display panel 120 and the light-blocking member 140, and the light-blocking member 140 extends along side portions of the display panel 120 and is attached to the rear surface of the film member 110. Accordingly, this configuration may more effectively encapsulate the heat dissipation member(s) than a related-art configuration in which a transparent PET film is disposed to encapsulate a heat dissipation member disposed on the rear surface of a display panel and prevent light leakage.

Figure 7:
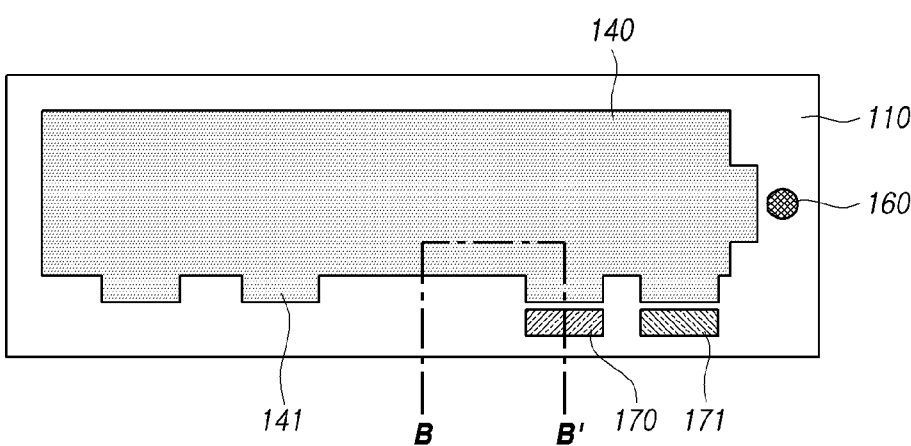
FIG. 7 is a plan diagram illustrating a display device according to one or more embodiments of the present disclosure.
Figure 8:
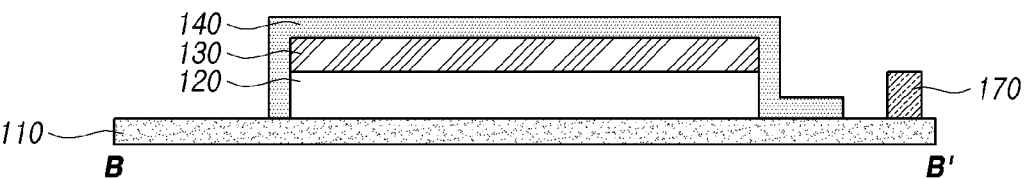
FIG. 8 is a cross-sectional diagram illustrating the display device taken along the line B-B' according to one or more embodiments of the present disclosure.

FIG. 7 is a plan diagram illustrating a display device according to other embodiments, and FIG. 8 is a cross-sectional diagram illustrating the display device taken along the line B-B'.

Referring to FIGS. 7 and 8, components, such as a camera 160 and sensors 170 and 171, are disposed outside the film member 110. Portions 141 of the light-blocking member 140 may extend to be disposed in areas corresponding to areas in which the components are disposed.

The portions 141 of the light-blocking member 140 may extend predetermined lengths outside the film member 110 and be attached to the film member 110.

The portions 141, rather than the entire area, of the light-blocking member 140 may extend predetermined lengths outside the film member 110 and be attached to the film member 110. The remaining portion of the light-blocking member 140 may extend along side portions of the display panel 120 and be attached to the rear surface of the film member 110, instead of extending outside the film member 110.

In addition, in areas corresponding to the components 160, 170, and 171 disposed outside the film member 110, the portions 141 of the light-blocking member 140 may extend the predetermined lengths outside the film member 110 to positions adjacent to areas in which the components 160, 170, and 171 are located and be attached to the film member 110. The other portion of the light-blocking member 140 may extend along side portions of the display panel 120 and be attached to the rear surface of the film member 110.

When the portions 141 of the light-blocking member 140 extend the predetermined lengths outside the film member 110 and are attached to the rear surface of the film member 110, only a specific area may be increased, thereby further reducing the width of the bezel.

Figure 9:
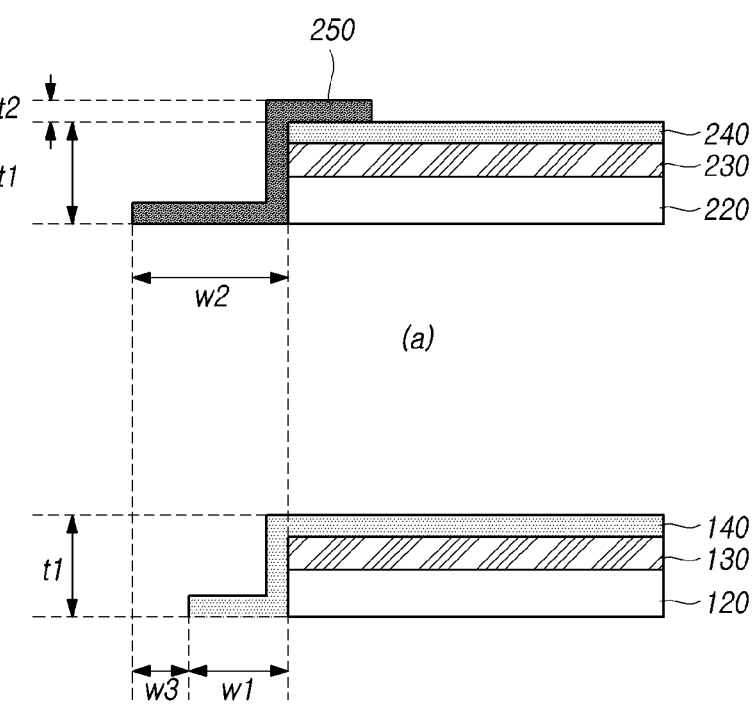
FIG. 9 is a diagram illustrating decreases in the width of a bezel and the thickness of a module in display devices according to one or more embodiments of the present disclosure.

FIG. 9 is a diagram illustrating decreases in the width of a bezel and the thickness of a module in display devices according to embodiments.

Specifically, part (a) in FIG. 9 is a cross-sectional diagram illustrating a related-art display device having a structure in which a heat dissipation member 230 disposed on the rear surface of a display panel 220 is encapsulated using a transparent PET film 240, and part (b) in FIG. 9 is a cross-sectional diagram illustrating a display device according to embodiments in which a colored PET film is applied as the light-blocking member 140.

Referring to part (a) of FIG. 9, in a module fabrication process of the related-art display device, the transparent PET film 240 is disposed to encapsulate the heat dissipation member 230 disposed on the rear surface of the display panel 220.

Light-blocking member 250 is attached to prevent light leakage occurring from the rear surface of the display panel 220. In some embodiments, the light-blocking member may be a light-blocking film or a light-blocking tape. An edge of the light-blocking member 250 extends along a side portion of the display panel 220 and outside the display panel 220 from the side portion so as to overlap the transparent PET film 240.

The thickness of the related-art module to which the light-blocking member 250 is attached is a sum t1+t2 of the thickness t1 of a structure comprised of the display panel 220, the heat dissipation member 230 and the transparent PET film 240 stacked on each other and the thickness t2 of the light-blocking member 250.

The width of the module to which the light-blocking member 250 is attached is the width w2 to an area extending outward from a side portion of the display panel 220, due to limitations in the attachment process of the light-blocking member 250.

In contrast, referring to part (b) of FIG. 9, in a module fabrication process of the display device according to embodiments, the light-blocking member 140 is provided to encapsulate the heat dissipation member 130 disposed on the rear surface of the display panel 120. The light-blocking member 140 extends along a side portion of the display panel 120 and outside the display panel 120, and is attached to the display panel 120.

In embodiments of the present disclosure, the light-blocking member 140 may be a colored PET film. The colored PET film may be a black PET film.

According to embodiments of the present disclosure, the thickness of the module is the thickness t1 of a structure comprised of the display panel 120, the heat dissipation member 130, and the light-blocking member 140 stacked on one another.

According to embodiments of the present disclosure, the width of the module is the width w1 of an area of the light-blocking member 140 extending outward from a side portion of the display panel 120.

Accordingly, the thickness t1 of the module of the display device according to embodiments of the present disclosure is reduced by the thickness t2 of the light-blocking member 250 from the thickness t1+t2 of the related-art module. In addition, the width of the bezel is reduced by a width w3, i.e., a difference between the width w1 of the extension of the light-blocking member 140 and the width w2 of the extension of the light-blocking member 250.

In the display device according to embodiments of the present disclosure, the light-blocking film disposed on the entire rear surface of the display panel, extending along side portions of the display panel, and attached to the film member disposed on the entire front surface of the display panel is introduced. Accordingly, it is possible to prevent light leakage occurring from the rear surface and side surfaces of the display panel, reduce the width of the bezel and the thickness of the module, simplify a fabrication process, and improve the reliability of products by reducing defects in the process.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention.

What is claimed is:

1. A display device comprising:
   a display panel comprising a front surface and a rear surface;
   a film member comprising a front surface and a rear surface, the front surface of the display panel attached to a first portion of the rear surface of the film member; and
   a light-blocking member on an entire rear surface of the display panel, the light-blocking member extending along a side portion of the display panel and attached to a second portion of the rear surface of the film member.

2. The display device according to claim 1, wherein the film member extends beyond each end of the light-blocking member by a predetermined length.

3. The display device according to claim 1, wherein a portion of the light-blocking member extends a predetermined length outside the film member.

4. The display device according to claim 1, wherein the light-blocking member comprises a colored light-blocking film.

5. The display device according to claim 1, wherein the film member comprises at least one of a touch member, a polarizer member, or a cover window.

6. The display device according to claim 5, wherein the touch member is on the front surface of the display panel, and
   the light-blocking member extends along a side portion of the display panel and a side portion of the touch member, and the light-blocking member is attached to the rear surface of the film member.

7. The display device according to claim 5, wherein the polarizer member is on the front surface of the display panel, and
   the light-blocking member extends along a side portion of the display panel and a side portion of the polarizer member, and the light-blocking member is attached to the rear surface of the film member.

8. The display device according to claim 5, wherein the touch member and the polarizer member are on the front surface of the display panel, and
   the light-blocking member extends along a side portion of the display panel, a side portion of the touch member, and a side portion of the polarizer member, and the light-blocking member is attached to a rear surface of the cover window.

9. The display device according to claim 1, further comprising:
   a heat dissipation member between the display panel and the light-blocking member.

10. The display device according to claim 9, wherein the heat dissipation member comprises a carbon material or a metal material.

11. The display device according to claim 9, wherein the heat dissipation member comprises a first heat dissipation member, the first heat dissipation member comprising a metal material.

12. The display device according to claim 11, further comprising:
   a second heat dissipation member between the first heat dissipation member and the light-blocking member, the second heat dissipation member comprising a carbon material.

13. The display device according to claim 9, wherein the heat dissipation member comprises a second heat dissipation member, the second heat dissipation member comprising a carbon material.

14. The display device according to claim 13, further comprising:
   a first heat dissipation member between the second heat dissipation member and the light-blocking member, the first heat dissipation member comprising a metal material.

15. A display device comprising:
   a film member;
   a display panel on the film member; and a light-blocking member on the display panel, the light-blocking member comprising:

a first portion that overlaps a planar surface of the display panel;

a second portion that extends from the first portion and overlaps a side surface of the display panel; and a third portion that extends from the second portion and is in contact with the film member.

16. The display device of claim 15, wherein the third portion of the light-blocking member has a predetermined width.

17. The display device of claim 15, wherein the film member comprises at least one of a touch member configured to sense a touch of the display device, a polarization member configured to polarize light emitted by the display panel, or a heat dissipation member configured to dissipate heat generated by the display panel.

18. The display device of claim 17, wherein the film member comprises the touch member and the polarization member, and the second portion of the light-blocking member overlaps a side surface of the touch member and the third portion of the light-blocking member is in contact with a surface of the polarization member.

19. The display device of claim 17, wherein the film member comprises the touch member, the heat dissipation member, and the polarization member, wherein the heat dissipation member is between the light-blocking member and the display panel, and the touch member is between the display panel and the polarization member.

20. The display device of claim 19, wherein the second portion of the light-blocking member overlaps a side surface of the heat dissipation member, a side surface of the touch member, and a side surface of the polarization member.

21. The display device of claim 15, wherein the film member comprises a first heat dissipation member comprising a first material and a second heat dissipation member comprising a second material that is different from the first material.

22. A display device comprising:

a display panel comprising a front surface and a rear surface;

a film member comprising a front surface and a rear surface, a first portion of the rear surface of the film member attached to the front surface of the display panel; and a light-blocking member comprising:

a first portion attached to the rear surface of the display panel, the first portion covering the rear surface of the display panel in its entirety;

a second portion connected to the first portion, the second portion extending along a side surface of the display panel, and covering the side surface of the display panel;

a third portion connected to the second portion, the third portion attached to a second portion of the rear surface of the film member that is non-overlapping with the display panel.

23. The display device of claim 22, wherein the third portion extends beyond the display panel by a predetermined width.

24. The display device of claim 22, wherein the film member comprises at least one of a touch member configured to sense a touch of the display device, a polarization member configured to polarize light emitted by the display panel, or a heat dissipation member configured to dissipate heat generated by the display panel.

25. The display device of claim 19, wherein the film member comprises a first heat dissipation member comprising a first material and a second heat dissipation member comprising a second material that is different from the first material.

* * * * *